(12) United States Patent
Gupta

(10) Patent No.: US 11,869,841 B2
(45) Date of Patent: Jan. 9, 2024

(54) METHODS OF FORMING MICROELECTRONIC DEVICES, AND RELATED MICROELECTRONIC DEVICES, MEMORY DEVICES, AND ELECTRONIC SYSTEMS

(71) Applicant: Micron Technology, Inc., Boise, ID (US)

(72) Inventor: Sidhartha Gupta, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 32 days.

(21) Appl. No.: 16/952,939

(22) Filed: Nov. 19, 2020

(65) Prior Publication Data
US 2022/0157725 A1 May 19, 2022

(51) Int. Cl.
| | |
|---|---|
| *H01L 23/535* | (2006.01) |
| *H01L 23/528* | (2006.01) |
| *H01L 21/768* | (2006.01) |
| *H10B 41/27* | (2023.01) |
| *H10B 41/41* | (2023.01) |
| *H10B 43/27* | (2023.01) |
| *H10B 43/40* | (2023.01) |

(52) U.S. Cl.
CPC ...... *H01L 23/535* (2013.01); *H01L 21/76805* (2013.01); *H01L 21/76895* (2013.01); *H01L 23/5283* (2013.01); *H10B 41/27* (2023.02); *H10B 41/41* (2023.02); *H10B 43/27* (2023.02); *H10B 43/40* (2023.02)

(58) Field of Classification Search
CPC ......... H01L 27/11582; H01L 27/11556; H01L 27/11565; H01L 27/1157; H01L 27/11575
See application file for complete search history.

(56) References Cited

U.S. PATENT DOCUMENTS

| | | | |
|---|---|---|---|
| 2014/0167259 A1* | 6/2014 | Fay | H01L 24/11 257/737 |
| 2021/0020566 A1* | 1/2021 | Zhu | H01L 27/1157 |
| 2021/0391353 A1* | 12/2021 | Zhao | G11C 16/08 |

* cited by examiner

*Primary Examiner* — Tony Tran
(74) *Attorney, Agent, or Firm* — TraskBritt

(57) ABSTRACT

A microelectronic device comprises pillar structures comprising semiconductive material, contact structures in physical contact with upper portions of the pillar structures, and conductive structures over and in physical contact with the contact structures. Each of the conductive structures comprises a lower portion having a first horizontal width, an upper portion vertically overlying the lower portion and having a second horizontal width greater than the first horizontal width, and an additional portion vertically interposed between the lower portion and the upper portion and having arcuate horizontal boundaries defining additional horizontal widths varying from the first horizontal width proximate the lower portion to a relatively larger horizontal width proximate the upper portion. Memory devices, electronic systems, and methods of forming microelectronic devices are also described.

7 Claims, 7 Drawing Sheets

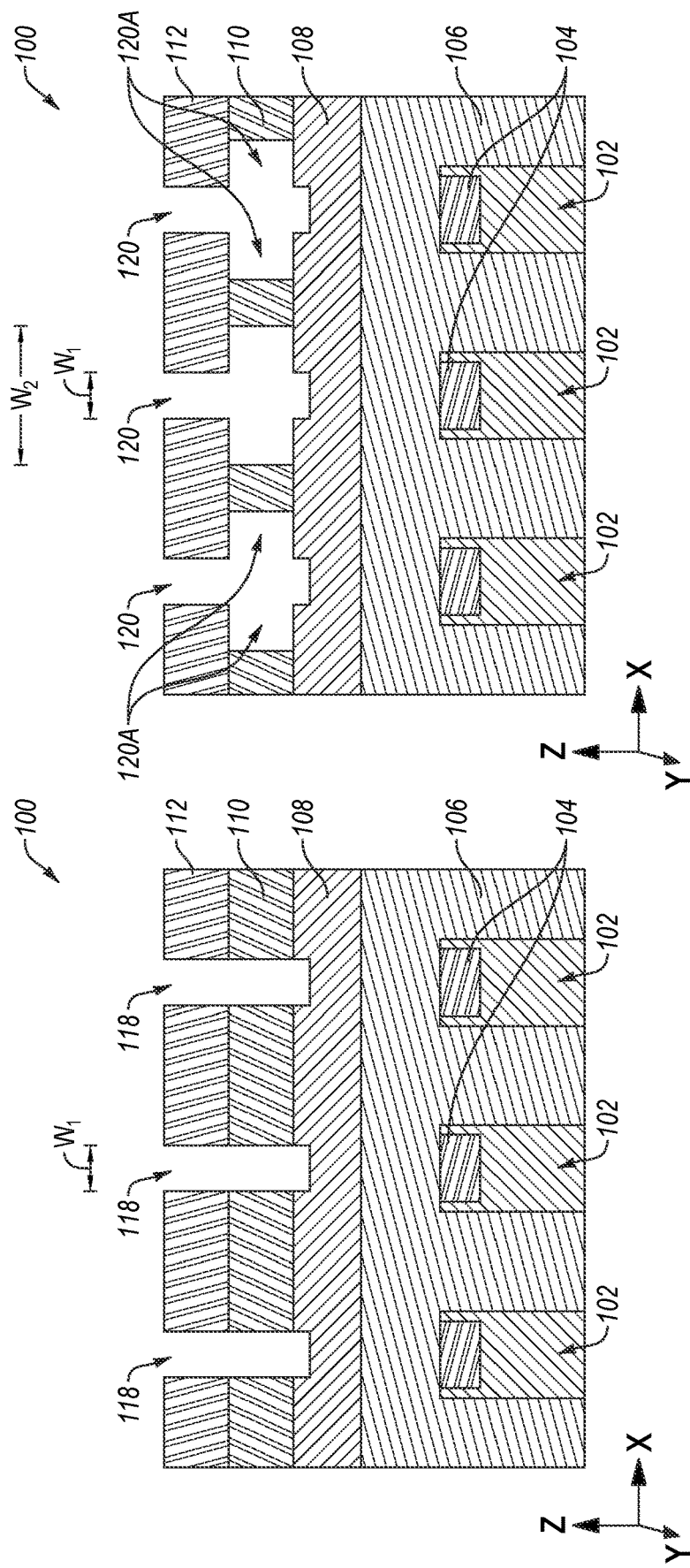

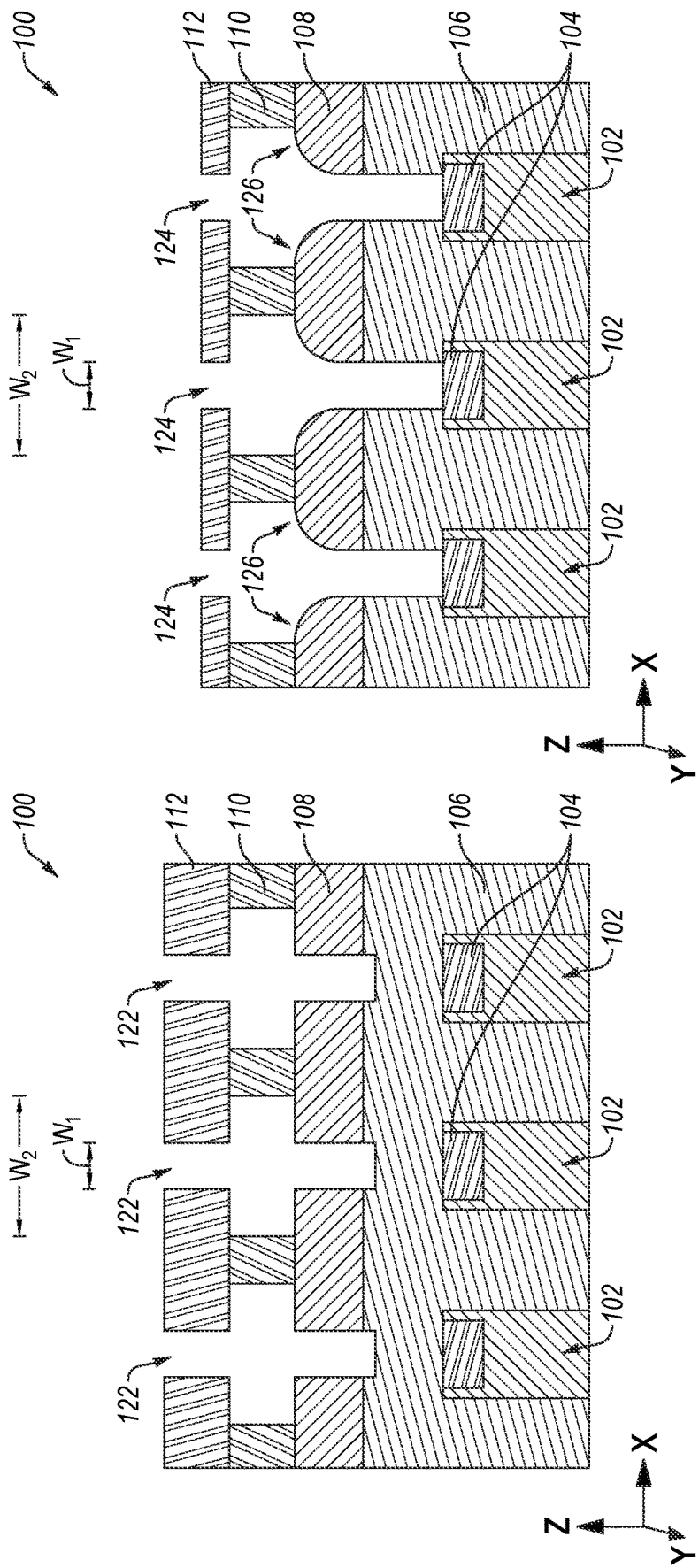

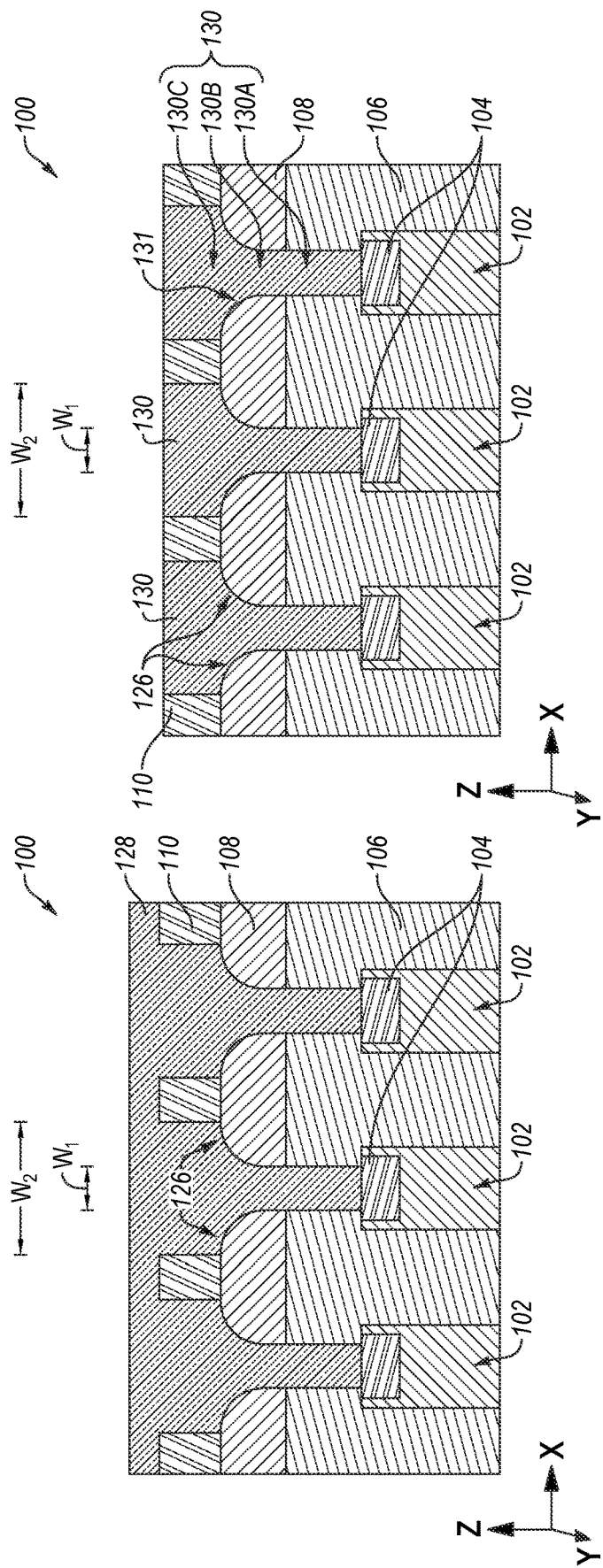

METHODS OF FORMING MICROELECTRONIC DEVICES, AND RELATED MICROELECTRONIC DEVICES, MEMORY DEVICES, AND ELECTRONIC SYSTEMS

TECHNICAL FIELD

The disclosure, in various embodiments, relates generally to the field of microelectronic device design and fabrication. More specifically, the disclosure relates to methods of forming microelectronic devices, and to related microelectronic devices, memory devices, and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often seek to design architectures that are not only compact, but offer performance advantages, as well as simplified designs.

One example of a microelectronic device is a memory device. Memory devices are generally provided as internal integrated circuits in computers or other electronic devices. There are many types of memory devices including, but not limited to, non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes strings of memory cells vertically extending through openings in one or more decks (e.g., stack structures) including tiers of conductive structures and insulative structures. Each string of memory cells may include at least one select device coupled thereto. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Reducing the dimensions and spacing of memory device features places ever increasing demands on the methods used to form the memory device features. For example, 3D NAND Flash memory device manufacturers face a tremendous challenge on reducing vertical memory array area as feature spacing decreases to accommodate increased feature density. Reducing spacing between closely arranged conductive structures (e.g., conductive plug structures, conductive contact structures) coupling digit line structures to strings of memory cells may, for example, lead to undesirable electrical coupling (e.g., capacitive coupling) effects that can result in programming time (tPROG) margin loss for high-speed memory applications.

BRIEF DESCRIPTION OF THE DRAWINGS

FIGS. 1A through 1I are partial cross-sectional views illustrating a method of forming a microelectronic device, in accordance with embodiments of the disclosure.

DETAILED DESCRIPTION

Figure 1B:
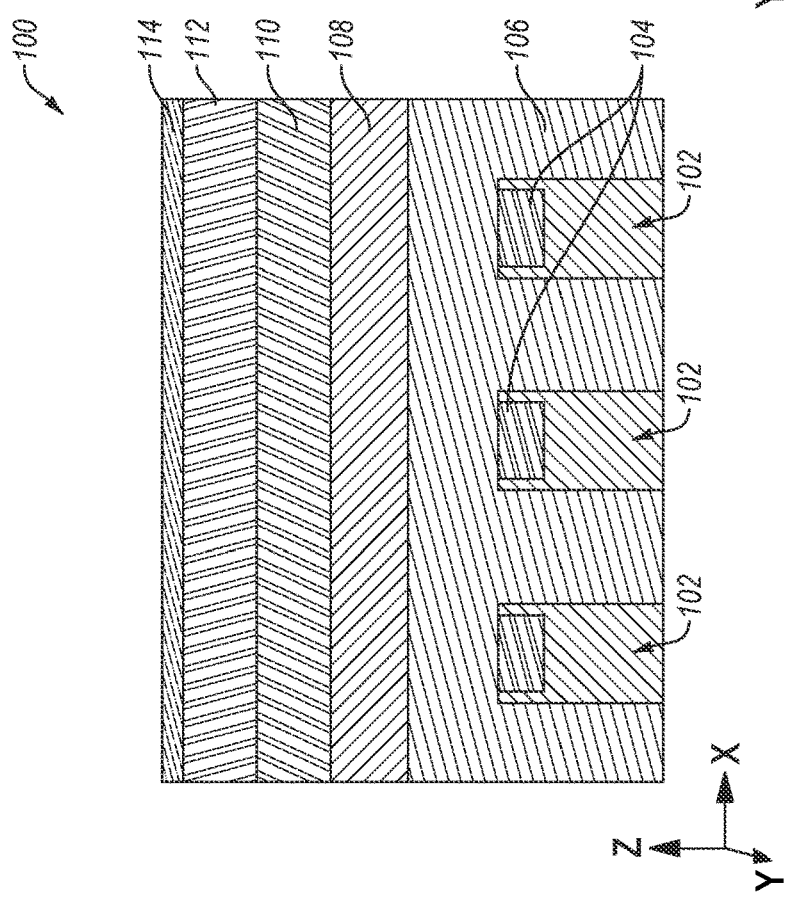

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the term "substrate" means and includes a base material or construction upon which additional materials are formed. The substrate may be a semiconductor substrate, a base semiconductor layer on a supporting structure, a metal electrode, or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. By way of non-limiting example, a substrate may comprise at least one of silicon, silicon dioxide, silicon with native oxide, silicon nitride, a carbon-containing silicon nitride, glass, semiconductor, metal oxide, metal, titanium, titanium nitride, carbon-containing titanium nitride, tantalum, tantalum nitride, carbon-containing tantalum nitride, niobium, niobium nitride, carbon-containing niobium nitride, molybdenum, molybdenum nitride, carbon-containing molybdenum nitride, tungsten, tungsten nitride, carbon-containing tungsten nitride, copper, cobalt, nickel, iron, aluminum, and a noble metal.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

FIGS. 1A through 1I are simplified partial cross-sectional views illustrating embodiments of a method of forming a microelectronic device (e.g., a memory device, such as a 3D NAND Flash memory device). The microelectronic devices formed through the methods of the disclosure may include configurations effectuating reduced capacitive coupling between conductive structures (e.g., conductive contact structures, conductive plug structures) as compared to conventional configurations. The microelectronic devices formed through the methods of the disclosure may have reduced conductive line (e.g., digit line, bit line) capacitance as compared to conventional microelectronic devices formed through conventional methods. With the description provided below, it will be readily apparent to one of ordinary skill in the art that the methods and structures described herein may be used in various devices and electronic systems.

Figure 1A:
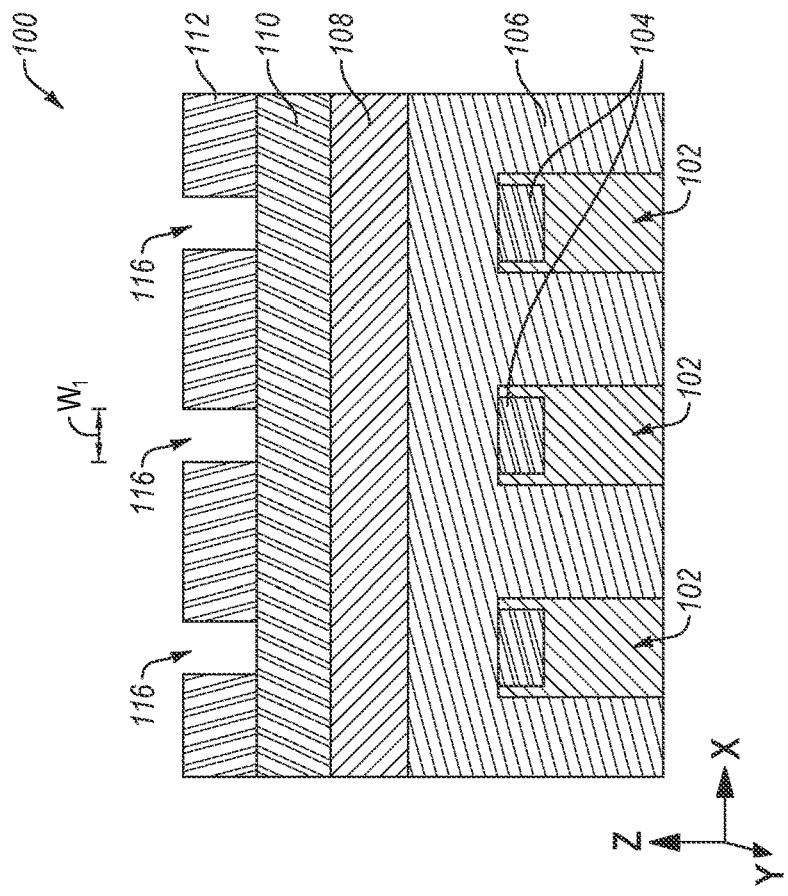

Referring to FIG. 1A, a microelectronic device structure 100 may be formed to include cell pillar structures 102; pillar contact structures 104 on, over, and/or within upper portions (e.g., in the Z-direction) of the cell pillar structures 102; a first dielectric material 106 surrounding the cell pillar structures 102 and the pillar contact structures 104; a second dielectric material 108 on or over the first dielectric material 106; a third dielectric material 110 on or over the second dielectric material 108; a first masking material 112 on or over the third dielectric material 110; and a second masking material 114 on or over the first masking material 112. As described in further detail below, the cell pillar structures 102 may vertically extend (e.g., in the Z-direction) through a stack structure vertically underlying the first dielectric material 106, wherein the stack structure includes a vertically alternating sequence of conductive structures (e.g., access line structures, word line structures) and insulative structures arranged in tiers each including at least one of the conductive structures and at least one of the insulative structures.

The cell pillar structures 102 may each be formed of and include multiple (e.g., a plurality) materials facilitating the formation of vertically extending (e.g., in the Z-direction) strings of memory cells. By way of non-limiting example, each of the cell pillar structures 102 may individually be formed to include a charge-blocking material, a charge-trapping material, a tunnel dielectric material, a channel material, and a dielectric fill material. The dielectric fill material may be outwardly horizontally surrounded by the channel material; the channel material may be outwardly horizontally surrounded the tunnel dielectric material; the tunnel dielectric material may be outwardly horizontally surrounded by the charge-trapping material; and the charge-trapping material may be outwardly horizontally surrounded by the charge-blocking material. The charge-blocking material may, for example, be formed of and include a first dielectric oxide material, such as one or more of $SiO_x$ (e.g., $SiO_2$) and $AlO_x$ (e.g., $Al_2O_3$). The charge-trapping material may, for example, be formed of and include a dielectric nitride material, such as $SiN_y$ (e.g., $Si_3N_4$). The tunnel dielectric material may, for example, be formed of and include a second oxide dielectric material, such as $SiO_x$ (e.g., $SiO_2$). The channel material may, for example, be formed of and include semiconductive material, such as one or more silicon, (e.g., polycrystalline silicon), germanium, silicon-germanium, and oxide semiconductive material (e.g., one or more of zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_xGa_ySi_zO$, commonly referred to as "IGSO"), indium tungsten oxide ($In_xW_yO$, commonly referred to as "IWO"), indium oxide ($In_xO$), tin oxide ($Sn_xO$), titanium oxide (TiO), zinc oxide nitride ($Zn_xON_z$), magnesium zinc oxide ($Mg_xZn_yO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials). The dielectric fill material may, for example, be formed of and include one or more of a dielectric oxide material, a dielectric nitride material, and air.

As described in further detail below with reference to FIG. 2, intersections of the cell pillar structures 102 and the conductive structures of the tiers of the stack structure vertically underlying the first dielectric material 106 may define vertically extending strings of memory cells coupled in series with one another within the stack structure. In some embodiments, the memory cells formed at the intersections of the conductive structures and the cell pillar structures 102 within each the tiers of the stack structure comprise so-called "MONOS" (metal-oxide-nitride-oxide-semiconductor) memory cells. In additional embodiments, the memory cells comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells comprise so-called "floating gate" memory cells including floating gates (e.g., metallic floating gates) as charge storage structures. The floating gates may horizontally intervene between central structures of the cell pillar structures 102 and the conductive structures of the different tiers of the stack structure.

The pillar contact structures 104 may contact (e.g., physically contact, electrically contact) the channel material of the cell pillar structures 102. As shown in FIG. 1A, in some embodiments, the pillar contact structures 104 at least partially (e.g., substantially) vertically extend into the cell pillar structures 102. For individual pillar contact structures 104, at least a portion thereof may be positioned within vertical boundaries of an individual cell pillar structure 102, and may be horizontally surrounded by and contact (e.g., physically contact, electrically contact) the channel material of the cell pillar structure 102 at inner horizontal boundaries (e.g., inner sidewalls) of the channel material. In some embodiments, uppermost vertical boundaries (e.g., uppermost surfaces) of the pillar contact structures 104 are substantially coplanar with uppermost vertical boundaries (e.g., uppermost surfaces) of the cell pillar structures 102. In additional embodiments, uppermost vertical boundaries of one or more of the pillar contact structures 104 are offset from (e.g., vertically overlie) the uppermost vertical boundaries of the cell pillar structures 102. For example, for individual pillar contact structures 104, a vertically upper portion thereof may be located vertically above an uppermost vertical boundary of the cell pillar structure 102 in contact therewith. A vertically upper portion of an individual pillar contact structure 104 may, for example, horizontally extend beyond horizontal boundaries of the vertically lower portion of the pillar contact structure 104 within vertical boundaries of an individual cell pillar structure 102, and may contact (e.g., physically contact, electrically contact) the channel material of the individual cell pillar structure 102 at the uppermost vertical boundary of the channel material.

The pillar contact structures 104 may be formed of and include conductive material. As a non-limiting example, the pillar contact structures 104 may each individually be formed of and include one or more of at least one conductively doped semiconductor material, at least one metal, at least one alloy, and at least one conductive metal-containing material (e.g., a conductive metal nitride, a conductive metal silicide, a conductive metal carbide, a conductive metal oxide). In some embodiments, each of the pillar contact structures 104 is formed of and includes polycrystalline silicon doped with one or more conductivity-enhancing dopants (e.g., one or more N-type dopants, one or more P-type dopants). Each of the pillar contact structures 104 may individually be substantially homogeneous, or one or more of the pillar contact structures 104 may individually be heterogeneous.

Still referring to FIG. 1A, the first dielectric material 106 may be formed to cover and surround portions of the cell pillar structures 102 and the pillar contact structures 104. An uppermost vertical boundary (e.g., an uppermost surface) of the first dielectric material 106 may vertically overlie uppermost vertical boundaries (e.g., uppermost surfaces) of the cell pillar structures 102 and the pillar contact structures 104. The first dielectric material 106 may substantially surround and physically contact upper portions of outer side surfaces (e.g., outer sidewalls) the cell pillar structures 102, and may also substantially cover and physically contact upper surfaces of the pillar contact structures 104. The first dielectric material 106 may also substantially cover and physically contact upper surfaces of the cell pillar structures 102 that are substantially coplanar with the upper surfaces of the pillar contact structures 104. A lower vertical boundary (e.g., a lower surface) of the first dielectric material 106 may be non-planar, and an upper vertical boundary (e.g., an upper surface) may be substantially planar.

The first dielectric material 106 may be formed of and include at least one insulative material. By way of non-limiting example, the first dielectric material 106 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), at least one dielectric oxycarbide material (e.g., $SiO_xC_y$), at least one hydrogenated dielectric oxycarbide material (e.g., $SiC_xO_yH_z$), and at least one dielectric carboxynitride material (e.g., $SiO_xC_zN_y$). In some embodiments, the first dielectric material 106 is formed of and includes at least one dielectric oxide material, such as $SiO_x$ (e.g $SiO_2$). The first dielectric material 106 may be substantially homogeneous, or the first dielectric material 106 may be heterogeneous.

The second dielectric material 108 may be formed of and include at least one additional insulative material that may be selectively removed relative to the first dielectric material 106 (as described in further detail below). A material composition of the second dielectric material 108 is different than a material composition of the first dielectric material 106. The second dielectric material 108 may be selectively etchable relative to the first dielectric material 106 during common (e.g., collective, mutual) exposure to a first etchant; and the first dielectric material 106 may be selectively etchable relative to the second dielectric material 108 during common exposure to a second, different etchant. As used herein, a material is "selectively etchable" relative to another material if the material exhibits an etch rate that is at least about five times (5×) greater than the etch rate of another material, such as about ten times (10×) greater, about twenty times (20×) greater, or about forty times (40×) greater. By way of non-limiting example, depending on the material composition of the first dielectric material 106, the second dielectric material 108 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), at least one dielectric oxycarbide material (e.g., $SiO_xC_y$), at least one hydrogenated dielectric oxycarbide material (e.g., $SiC_xO_yH_z$), and at least one dielectric carboxynitride material (e.g., $SiO_xC_zN_y$). In some embodiments, such as embodiments wherein the first dielectric material 106 is formed of and includes a dielectric oxide material (e.g., $SiO_x$, such as $SiO_2$), the second dielectric material 108 is formed of and includes a dielectric nitride material (e.g., $SiN_y$, such as $Si_3N_4$). The second dielectric material 108 may be substantially homogeneous, or the second dielectric material 108 may be heterogeneous.

The third dielectric material 110 may be formed of and include at least one further insulative material that may be selectively removed relative to the second dielectric material 108 (as described in further detail below). A material composition of the third dielectric material 110 is different than a material composition of the second dielectric material 108. The third dielectric material 110 may be selectively etchable relative to the second dielectric material 108 during common (e.g., collective, mutual) exposure to a first etchant; and the second dielectric material 108 may be selectively etchable relative to the third dielectric material 110 during common exposure to a second, different etchant. The material composition of the third dielectric material 110 may be substantially the same as the material composition of the first dielectric material 106, or the material composition of the third dielectric material 110 may be different than the material composition of the first dielectric material 106. As a non-limiting example, depending on the material composition of the second dielectric material 108, the third dielectric material 110 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), at least one dielectric oxycarbide material (e.g., $SiO_xC_y$), at least one hydrogenated dielectric oxycarbide material (e.g., $SiC_xO_yH_z$), and at least one dielectric carboxynitride material (e.g., $SiO_xC_zN_y$). In some embodiments, such as embodiments wherein the second dielectric material 108 is formed of and includes a dielectric nitride material (e.g., $SiN_y$, such as $Si_3N_4$), the third dielectric material 110 is formed of and includes a dielectric oxide material (e.g., $SiO_x$, such as $SiO_2$). The third dielectric material 110 may be substantially homogeneous, or the third dielectric material 110 may be heterogeneous.

The first masking material 112 may be formed of and include at least one material (e.g., at least one hard mask material) suitable for use as an etch mask to pattern portions of the third dielectric material 110, the second dielectric material 108, and the first dielectric material 106 to form apertures (e.g., openings, vias) vertically extending to the pillar contact structures 104 and having desirable geometric configurations (e.g., shapes, dimensions), as described in further detail below. By way of non-limiting example, the first masking material 112 may be formed of and include one or more hard mask materials having etch selectivity relative to the materials of the third dielectric material 110, the second dielectric material 108, and the first dielectric material 106. In some embodiments, the first masking material 112 is formed of and includes one or more of amorphous carbon and doped amorphous carbon (e.g., boron-doped amorphous carbon, such as boron-doped amorphous carbon comprising at least 1 weight percent (wt %) boron and at least 20 wt % carbon, such as between about 1 wt % boron and about 40 wt % boron, and between about 99 wt % carbon and about 60 wt % carbon). The first masking material 112 may be substantially homogeneous, or the first masking material 112 may be heterogeneous.

The second masking material 114 may be formed of and include at least one material (e.g., at least one resist material) suitable for use as an etch mask to pattern portions of the first masking material 112, as described in further detail below. By way of non-limiting example, the second masking material 114 may be formed of and include at least one photoresist material, such as a positive tone photoresist material, or a negative tone photoresist material. If the second masking material 114 comprises a positive tone photoresist material, the second masking material 114 may be formulated such that regions thereof exposed to at least a minimum threshold dosage of electromagnetic radiation and, optionally, a post-exposure bake become at least partially soluble in a suitable developer (e.g., a positive tone developer). Photoexposed regions (e.g., regions exposed to the minimum threshold dosage of electromagnetic radiation) of the second masking material 114 may be at least partially (e.g., substantially) removed by the developer while non-photoexposed regions (e.g., regions not exposed to the minimum threshold dosage of electromagnetic radiation) may remain substantially intact (e.g., not substantially removed). Alternatively, if the second masking material 114 comprises a negative tone photoresist material, the second masking material 114 may be formulated such that regions thereof not exposed to at least a minimum threshold dosage of electromagnetic radiation are at least partially soluble in a suitable developer (e.g., a negative tone developer). Non-photoexposed regions of the second masking material 114 may be at least partially (e.g., substantially) removed by the developer while photoexposed regions may remain substantially intact (e.g., not substantially removed). The properties (e.g., tone) of the second masking material 114 may be selected relative to material composition of the first masking material 112 to facilitate desired patterning of the first masking material 112, as described in further detail below. Suitable photoresist materials (e.g., positive tone photoresist materials, negative tone photoresist materials) are known in the art, and are, therefore, not described in detail herein. The second masking material 114 may, for example, be compatible with 13.7 nm, 157 nm, 193 nm, 248 nm, or 365 nm wavelength systems; with 193 nm wavelength immersion systems; and/or with electron beam lithographic systems. The second masking material 114 may be substantially homogeneous, or the second masking material 114 may be heterogeneous.

Referring next to FIG. 1B, the second masking material 114 (FIG. 1A) and first masking material 112 may be subjected to at least one patterning and material removal process to form first openings 116 (e.g., apertures, vias) vertically extending through the first masking material 112. As shown in FIG. 1B, the first openings 116 may vertically extend (e.g., in the Z-direction) completely through the first masking material 112, from an uppermost vertical boundary (e.g., an uppermost surface) of the first masking material 112 to a lowermost vertical boundary (e.g., a lowermost surface) of the first masking material 112. The first openings 116 may vertically extend to and expose portions of the third dielectric material 110 underlying the first masking material 112. Exposed portions of the third dielectric material 110 may define lowermost vertical boundaries (e.g., floors, bottoms)

of the first openings 116. As shown in FIG. 1B, following the formation of the first openings 116 in the first masking material 112, remaining portions (if any) of the second masking material 114 (FIG. 1A) may be substantially removed to expose an upper surface of the first masking material 112.

A geometric configuration (e.g., shape, dimensions), horizontal position (e.g., in the X-direction and in the Y-direction), and horizontal spacing of each of the first openings 116 formed in the first masking material 112 at least partially depends on the geometric configurations, horizontal positions, and horizontal spacing of the pillar contact structures 104 and the cell pillar structures 102. The first openings 116 may be formed to be at least partially horizontally aligned (e.g., in the X-direction and in the Y-direction) with the pillar contact structures 104 and the cell pillar structures 102. In addition, the first openings 116 may be formed to have horizontal dimensions (e.g., in the X-direction and in the Y-direction) less than or equal to corresponding horizontal dimensions of the cell pillar structures 102, such as less than or equal to corresponding horizontal dimensions of the pillar contact structures 104. As shown in FIG. 1B, in some embodiments, horizontal centers of the first openings 116 are formed to be substantially horizontally aligned with horizontal centers of the pillar contact structures 104. In addition, as also shown in FIG. 1B, in some embodiments, a width $W_1$ (e.g., diameter) of each of the first openings 116 is formed to be less than a width of the pillar contact structure 104 at least partially (e.g., substantially) horizontally aligned therewith.

In some embodiments, the first openings 116 are formed to exhibit substantially the same geometric configurations (e.g., substantially the same shapes and substantially the same dimensions) as one another. For example, each of the first openings 116 may be formed to exhibit a substantially circular horizontal cross-sectional shape, and may have substantially the same width $W_1$ (e.g., diameter) as each other of the first openings 116. In additional embodiments, one or more of the first openings 116 is formed to exhibit a different geometric configuration (e.g., a different shape, such as a non-circular horizontal cross-sectional shape; and/or different dimensions, such as a smaller width or a larger width) than one or more other of the first openings 116. For example, one or more of the first openings 116 may be formed to exhibit another width different than (e.g., larger than, smaller than) the width $W_1$.

The first openings 116 may be formed in the first masking material 112 by patterning (e.g., photolithographically patterning through selective photoexposure and development) the second masking material 114 (FIG. 1A), then transferring the resulting pattern in the second masking material 114 (FIG. 1A) to the first masking material 112 by way of at least one first material removal process (e.g., at least one first etching process, such as at least one first anisotropic etching process). Thereafter, remaining portions of the second masking material 114 (FIG. 1A) (if any) may be removed.

Referring next to FIG. 1C, portions of the third dielectric material 110 within horizontal boundaries of the first openings 116 (FIG. 1B) may be removed to extend the vertical depth of the first openings 116 (FIG. 1B) and form second openings 118. As shown in FIG. 1C, the second openings 118 may have substantially the same horizontal dimensions (e.g., in the X-direction and in the Y-direction, such as substantially the same width $W_1$) as the first openings 116 (FIG. 1B), and may vertically extend (in the Z-direction) completely through the third dielectric material 110. The second openings 118 may be formed to vertically extend to and expose portions of the second dielectric material 108 underlying the third dielectric material 110. Exposed portions of the second dielectric material 108 may define lowermost vertical boundaries (e.g., floors, bottoms) of the second openings 118. As shown in FIG. 1C, in some embodiments, the second openings 118 are formed to vertically extend into the second dielectric material 108, such that lower vertical boundaries of the second openings 118 are within vertical boundaries (e.g., between a lowermost vertical boundary and an uppermost vertical boundary) of the second dielectric material 108. In additional embodiments, the second openings 118 are formed to vertically terminate at an uppermost vertical boundary (e.g., an uppermost surface) of the second dielectric material 108, such that lower vertical boundaries of the second openings 118 are substantially coplanar with the uppermost vertical boundary of the second dielectric material 108.

The second openings 118 may be formed by subjecting the microelectronic device structure 100 at the processing stage depicted in FIG. 1B to at least one second material removal process. The second material removal process may, for example, comprise at least one anisotropic etching process (e.g., an anisotropic dry etching process, such as reactive ion etching (RIE), deep RIE, plasma etching, reactive ion beam etching, chemically assisted ion beam etching; an anisotropic wet etching process) employing at least one etchant more selective to the third dielectric material 110 than the first masking material 112 and the second dielectric material 108. The second material removal process may remove portions of the third dielectric material 110 within horizontal boundaries of the first openings 116 (FIG. 1B) without substantially removing portions of the first masking material 112 remaining following the processing stage previously described with reference to FIG. 1B. The second dielectric material 108 may serve as a so-called "etch stop" material for the second material removal process.

Referring next to FIG. 1D, additional portions of the third dielectric material 110 may be removed to horizontally expand (e.g., horizontally widen) the second openings 118 (FIG. 1C) and form third openings 120. As shown in FIG. 1D, the third openings 120 may exhibit substantially the same horizontal dimensions (e.g., in the X-direction and in the Y-direction) as the second openings 118 (FIG. 1C) within vertical boundaries (e.g., in the Z-direction) of the first masking material 112, and may exhibit greater (e.g., larger, wider) horizontal dimensions than the second openings 118 (FIG. 1C) within vertical boundaries of the third dielectric material 110. For example, as shown in FIG. 1D, the third openings 120 may individually have substantially the same width $W_1$ as the second openings 118 (FIG. 1C) within vertical boundaries of the first masking material 112, and may individually have an additional width $W_2$ greater than the width $W_1$ within vertical boundaries of third dielectric material 110. The third openings 120 may include undercut regions 120A horizontally extending under the first masking material 112. The undercut regions 120A may outwardly horizontally extend past the width $W_1$ of the second openings 118 (FIG. 1C) to the additional width $W_2$ defining horizontal dimensions of the third openings 120 within the third dielectric material 110. Lower vertical boundaries of the undercut regions 120A of the third openings 120 may be defined by an upper vertical boundary (e.g., an upper surface) of the second dielectric material 108, and upper vertical boundaries of the undercut regions 120A of the third openings 120 may be defined by a lower vertical boundary (e.g., a lower surface) of the first masking material 112.

The third openings 120 may be formed by subjecting the microelectronic device structure 100 at the processing stage depicted in FIG. 1C to at least one third material removal process. The third material removal process may, for example, comprise an isotropic etching process employing at least one etchant more selective to the third dielectric material 110 than the first masking material 112 and the second dielectric material 108. In some embodiments, such as embodiments wherein the third dielectric material 110 comprises a dielectric oxide material (e.g., $SiO_x$, such as $SiO_2$), the etchant comprises hydrofluoric acid (HF). The third material removal process may remove additional portions of the third dielectric material 110 outside horizontal boundaries of the second openings 118 (FIG. 1C) without substantially removing portions of the first masking material 112 and the second dielectric material 108 remaining following the processing stage previously described with reference to FIG. 1C.

Referring next to FIG. 1E, portions of the second dielectric material 108 within horizontal boundaries of the first openings 116 (FIG. 1B) may be removed to extend the vertical depth of the third openings 120 (FIG. 1D) and form fourth openings 122. The fourth openings 122 may be formed to vertically extend (in the Z-direction) completely through the second dielectric material 108. The fourth openings 122 may expose portions of the first dielectric material 106 underlying the second dielectric material 108. The exposed portions of the first dielectric material 106 may define lowermost vertical boundaries (e.g., floors, bottoms) of the fourth openings 122. As shown in FIG. 1E, in some embodiments, the fourth openings 122 are formed to vertically extend into the first dielectric material 106, such that lowermost vertical boundaries of the fourth openings 122 are within vertical boundaries (e.g., between a lowermost vertical boundary and an uppermost vertical boundary) of the first dielectric material 106. In additional embodiments, the fourth openings 122 are formed to vertically terminate at an uppermost vertical boundary (e.g., an uppermost surface) of the first dielectric material 106, such that lower vertical boundaries of the fourth openings 122 are substantially coplanar with the uppermost vertical boundary of the first dielectric material 106.

As shown in FIG. 1E, the fourth openings 122 may exhibit substantially the same horizontal dimensions (e.g., in the X-direction and in the Y-direction) as the third openings 120 (FIG. 1D) within vertical boundaries (e.g., in the Z-direction) of the first masking material 112 and the third dielectric material 110. In addition, the fourth openings 122 may exhibit substantially the same horizontal dimensions as the first openings 116 (FIG. 1B) within vertical boundaries of the second dielectric material 108. Vertically lower portions of the fourth openings 122 within vertical boundaries of the second dielectric material 108 may exhibit substantially the same horizontal dimensions as vertically upper portions of the fourth openings 122 within vertical boundaries of the first masking material 112, and may exhibit smaller (e.g., narrower) horizontal dimensions than vertically intervening portions the fourth openings 122 within vertical boundaries of the third dielectric material 110. For example, as shown in FIG. 1E, the fourth openings 122 may individually exhibit the width $W_1$ within vertical boundaries of the first masking material 112 and the second dielectric material 108, and may individually exhibit the additional width $W_2$ greater than the width $W_1$ within vertical boundaries of the third dielectric material 110.

The fourth openings 122 may be formed by subjecting the microelectronic device structure 100 at the processing stage depicted in FIG. 1D to at least one fourth material removal process. The fourth material removal process may, for example, comprise an anisotropic etching process (e.g., an anisotropic dry etching process; an anisotropic wet etching process) employing at least one etchant more selective to the second dielectric material 108 than each of the first masking material 112, the third dielectric material 110, and the first dielectric material 106. The fourth material removal process may remove portions of the second dielectric material 108 within horizontal boundaries of the first openings 116 (FIG. 1B) without substantially removing portions of the first masking material 112 and the third dielectric material 110 remaining following the processing stage previously described with reference to FIG. 1D. The first dielectric material 106 may serve as a so-called "etch stop" material for the fourth material removal process.

Referring next to FIG. 1F, portions of the first dielectric material 106 within horizontal boundaries of the first openings 116 (FIG. 1B) may be removed to extend the vertical depth of the fourth openings 122 (FIG. 1E) and form fifth openings 124. The fifth openings 124 may be formed to vertically extend (in the Z-direction) through the portions of the first dielectric material 106 vertically overlying the cell pillar structures 102. The fifth openings 124 may vertically extend to and expose portions of the pillar contact structures 104. The exposed portions of the pillar contact structures 104 may at least partially (e.g., substantially) define lowermost vertical boundaries (e.g., floors, bottoms) of the fifth openings 124. As shown in FIG. 1F, in some embodiments, the fifth openings 124 are formed to vertically terminate at uppermost vertical boundaries (e.g., uppermost surfaces) of the pillar contact structures 104, such that lower vertical boundaries of the fifth openings 124 are substantially coplanar with the uppermost vertical boundaries of the pillar contact structures 104. In additional embodiments, the fifth openings 124 are formed to vertically extend into the pillar contact structures 104, such that lowermost vertical boundaries of the fifth openings 124 are within vertical boundaries (e.g., between lowermost vertical boundaries and uppermost vertical boundaries) of the pillar contact structures 104.

As shown in FIG. 1E, the fifth openings 124 may exhibit substantially the same horizontal dimensions (e.g., in the X-direction and in the Y-direction) as the fourth openings 122 (FIG. 1E) within vertical boundaries (e.g., in the Z-direction) of the first masking material 112 and the third dielectric material 110, and may exhibit substantially the same horizontal dimensions as the first openings 116 (FIG. 1B) within vertical boundaries of the first dielectric material 106. In addition, within vertical boundaries of the second dielectric material 108, the fifth openings 124 may exhibit vertically lower regions exhibiting substantially the same horizontal dimensions as portions of the fourth openings 122 (FIG. 1E) within the vertical boundaries of second dielectric material 108; and vertically upper regions exhibiting greater (e.g., wider) horizontal dimensions than the portions of the fourth openings 122 (FIG. 1E) within the vertical boundaries of second dielectric material 108. The horizontal dimensions of the vertically upper regions may increase in a vertically upward direction within the second dielectric material 108, from horizontal dimensions (e.g., the width $W_1$) substantially the same as horizontal dimensions of portions of the fifth openings 124 within vertical boundaries of the first dielectric material 106, to relatively larger horizontal dimensions closer to or even substantially the same as horizontal dimensions (e.g., the additional width $W_2$) of other portions of the fifth openings 124 within vertical boundaries of the third dielectric material 110. For example, as shown in FIG.

1F, the fourth openings 122 may individually exhibit the width $W_1$ within vertical boundaries of the first masking material 112 and the first dielectric material 106, may individually exhibit the additional width $W_2$ greater than the width $W_1$ within vertical boundaries of the third dielectric material 110, and may individually exhibit different widths increasing in an upward vertical direction (e.g., the positive Z-direction) from the width $W_1$ to the additional width $W_2$ within vertical boundaries of the second dielectric material 108.

As shown in FIG. 1F, within vertical boundaries of the first masking material 112, the third dielectric material 110, and the first dielectric material 106, the fifth openings 124 may be formed to exhibit horizontal boundaries that are oriented substantially perpendicular (e.g., orthogonal) to upper vertical boundaries (e.g., upper surfaces) of the pillar contact structures 104 and the cell pillar structures 102. Put another way, within vertical boundaries of the first masking material 112, the third dielectric material 110, and the first dielectric material 106, horizontal boundaries of the fifth openings 124 may be oriented in parallel with horizontal boundaries (e.g., side surfaces, sidewalls) of the pillar contact structures 104 and the cell pillar structures 102. As used herein, the term "parallel" means substantially parallel. In addition, within vertical boundaries of the second dielectric material 108, the fifth openings 124 may be formed to exhibit horizontal boundaries that are at least partially not oriented perpendicular to the upper vertical boundaries of the pillar contact structures 104 and the cell pillar structures 102. For example, as depicted in FIG. 1F, within vertical boundaries of the second dielectric material 108, the fifth openings 124 may exhibit horizontal boundaries having arcuate (e.g., radiused, rounded, curved) shapes in one or more (e.g., all) vertically oriented (e.g., vertically extending) planes, such as the ZX-plane (e.g., the plane defined by the Z-direction and the X-direction) and/or the ZY-plane (e.g., the plane defined by the Z-direction and the Y-direction). Arcuate profiles of the fifth openings 124 within vertical boundaries of the second dielectric material 108 may be defined by arcuate edges 126 (e.g., radiused edges, rounded edges, curved edges) of the second dielectric material 108 formed as a result of a process (e.g., a material removal process) used to form the fifth openings 124, as described in further detail below.

The fifth openings 124 may be formed by subjecting the microelectronic device structure 100 at the processing stage depicted in FIG. 1E to yet at least one fifth material removal process. The fifth material removal process may, for example, comprise an anisotropic etching process (e.g., an anisotropic dry etching process; an anisotropic wet etching process) employing at least one etchant more selective to the first dielectric material 106 than the second dielectric material 108 and the pillar contact structures 104. The pillar contact structures 104 may serve as so-called "etch stop" structures for the fifth material removal process. The fifth material removal process may remove portions of the first dielectric material 106 at a relatively faster rate than portions of the second dielectric material 108 exposed within the fourth openings 122 (FIG. 1E). However, removal (e.g., etching) of the portions of the second dielectric material 108 during the fifth material removal process effectuates the arcuate edges 126 of the remaining portions of the second dielectric material 108 that provide the fifth openings 124 with arcuate profiles within vertical boundaries of the second dielectric material 108. As shown in FIG. 1F, the fifth material removal process may also remove a vertically upper portion of the first masking material 112, such that a remainder (e.g., a remaining portion) of the first masking material 112 following the fifth material removal process has a reduced vertical thickness (e.g., vertical height) as compared to a vertical thickness of the first masking material 112 prior to the fifth material removal process.

Referring next to FIG. 1G, a remainder (if any) of the first masking material 112 may be removed, and plug material 128 may be formed (e.g., non-conformably deposited) inside and outside of remaining portions of the fifth openings 124 (FIG. 1F). The plug material 128 may substantially fill the remaining portions of the fifth openings 124 (FIG. 1F). The plug material 128 may exhibit a substantially planar upper vertical boundary (e.g., upper surface), and a non-planar vertical lower boundary at least partially defined by a topography of surfaces (e.g., upper surfaces, side surfaces) of the third dielectric material 110, the second dielectric material 108, the first dielectric material 106, and the pillar contact structures 104 at and outside of boundaries of the fifth openings 124 (FIG. 1F).

The plug material 128 may be formed of and include conductive material. As a non-limiting example, the plug material 128 may be formed of and include one or more of at least one metal, at least one alloy, and at least one conductive metal-containing material (e.g., a conductive metal nitride, a conductive metal silicide, a conductive metal carbide, a conductive metal oxide). A material composition of the plug material 128 may be substantially the same as a material composition of the pillar contact structures 104, or the material composition of the plug material 128 may be different than the material composition of the pillar contact structures 104. In some embodiments, the plug material 128 is formed of and includes W. The plug material 128 may be homogeneous, or the plug material 128 may be heterogeneous.

The plug material 128 may be formed using conventional processes (e.g., conventional deposition processes) and conventional processing equipment, which are not described in detail herein. For example, the plug material 128 may be formed on or over exposed portions of the microelectronic device structure 100 using one or more conventional non-conformal deposition processes, such as one or more of a conventional non-conformal PVD process and a conventional non-conformal CVD process.

Referring next to FIG. 1H, portions of the plug material 128 (FIG. 1G) overlying an uppermost vertical boundary (e.g., an uppermost surface) of the third dielectric material 110 may be substantially removed to form plug structures 130. The removal process may expose (e.g., uncover) the third dielectric material 110. Uppermost vertical boundaries (e.g., uppermost surfaces) of the plug structures 130 may be formed to be substantially coplanar with the uppermost vertical boundary of the third dielectric material 110.

As shown in FIG. 1H, each of the plug structures 130 may individually include a first portion 130A (e.g., a lower portion) vertically adjacent one of the pillar contact structures 104 and within vertical boundaries of the first dielectric material 106, a second portion 130B (e.g., an intervening portion) within vertical boundaries of the second dielectric material 108, and a third portion 130C (e.g., an upper portion) within vertical boundaries of the third dielectric material 110. The second portion 130B may be vertically interposed between the first portion 130A and the third portion 130C, and may be integral and continuous with the first portion 130A and the third portion 130C. As described in further detail below, geometric configurations (e.g., shapes, dimensions) of the plug structures 130 may correspond to (e.g., may be substantially the same as) geometric configurations of the fifth openings 124 (FIG. 1F) within vertical boundaries of the first dielectric material 106, the second dielectric material 108, and the third dielectric material 110.

The first portion 130A and the third portion 130C of each of the plug structures 130 may have horizontal boundaries (e.g., side surfaces, sidewalls) oriented substantially perpendicular (e.g., orthogonal) to upper vertical boundaries (e.g., upper surfaces) of the pillar contact structures 104 and the cell pillar structures 102. For each plug structure 130, the horizontal boundaries of the first portion 130A and the third portion 130C thereof may be oriented parallel to one another and to horizontal boundaries of the pillar contact structure 104 and the cell pillar structure 102 operatively associated with the plug structure 130. In addition, the second portion 130B of each of the plug structures 130 may have horizontal boundaries at least partially oriented non-perpendicular to the upper vertical boundaries of the pillar contact structures 104 and the cell pillar structures 102. For each plug structure 130, the horizontal boundaries of the second portion 130B thereof may be at least partially oriented non-parallel to the horizontal boundaries of the first portion 130A and the third portion 130C of the plug structure 130 and non-parallel to the horizontal boundaries of the pillar contact structure 104 and the cell pillar structure 102 operatively associated with the plug structure 130. For example, the second portion 130B of each of the plug structures 130 may exhibit arcuate horizontal boundaries 131 (e.g., arcuate side surfaces, arcuate sidewalls) having radiused (e.g., rounded, curved, arcuate), concave cross-sectional shapes in one or more (e.g., all) vertically oriented planes, such as the ZY-plane and/or the ZX-plane. The radiused, concave shapes of the arcuate horizontal boundaries 131 of the second portions 130B of the plug structures 130 in one or more vertically oriented planes may complement (e.g., mirror) radiused, convex shapes of the arcuate edges 126 of the second dielectric material 108 in the one or more vertically oriented planes.

The first portion 130A of each of the plug structures 130 may have substantially uniform (e.g., substantially constant, substantially non-variable) horizontal dimensions (e.g., the width $W_1$) throughout a vertical dimension (e.g., vertical height) thereof. The horizontal dimensions of the first portion 130A may be less than horizontal dimensions of the cell pillar structure 102 operatively associated with the plug structure 130 (e.g., less than or equal to horizontal dimensions of the pillar contact structure 104 operatively associated with the plug structure 130). In addition, the third portion 130C of each of the plug structures 130 may also have substantially uniform (e.g., substantially constant, substantially non-variable) horizontal dimensions (e.g., the additional width $W_2$) throughout a vertical dimension (e.g., vertical height) thereof. The horizontal dimensions of the third portion 130C are greater that the horizontal dimensions of the first portion 130A of the plug structure 130. Furthermore, the second portion 130B of each of the plug structures 130 may have variable (e.g., substantially non-constant, substantially non-uniform) horizontal dimensions throughout a vertical dimension (e.g., vertical height) thereof. The horizontal dimensions of the second portion 130B at different vertical positions therein may be at least partially defined by the arcuate horizontal boundaries 131 of the second portion 130B. The horizontal dimensions (e.g., width) of the second portion 130B may increase in a direction (e.g., the positive Z-direction) moving away from the first portion 130A and toward the third portion 130C. As a non-limiting example, for an individual plug structure 130, the first portion 130A thereof may exhibit the width $W_1$ throughout an entire vertical height thereof; the third portion 130C thereof may exhibit the additional width $W_2$ greater than the width $W_1$ throughout an entire vertical height thereof; and the second portion 130B thereof may exhibit different widths throughout the vertical height thereof, from a relatively smaller width (e.g., the width $W_1$) proximate the first portion 130A of the plug structure 130 to a relatively greater width (e.g., the additional width $W_2$) proximate the third portion 130C of the plug structure 130.

Forming the plug structures 130 to have the geometric configuration described with reference to FIG. 1I may effectuate a reduction in capacitive coupling between horizontally neighboring plug structures 130 of the microelectronic device structure 100 as compared to capacitive coupling between conventional plug structures having conventional geometric configurations. For example, the geometric configurations of the first portion 130A, the second portion 130B (including the arcuate horizontal boundaries 131 thereof), and the third portion 130C of each of the plug structures 130 of the disclosure may reduce capacitive coupling between horizontally neighboring plug structures 130 relative to conventional geometric configurations simply exhibiting gradual tapering between horizontal cross-sectional areas of relatively higher portions of a plug structure and relatively lower portions of the plug structure. Accordingly, the geometric configurations of the plug structures 130 of the disclosure may enhance the performance (e.g., reduce capacitive coupling) of microelectronic devices (e.g., memory devices, such as 3D NAND Flash memory devices) of the disclosure including the plug structures 130 as compared to conventional microelectronic devices including plug structures having conventional geometric configurations.

The plug structures 130 may be formed by subjecting the microelectronic device structure 100 at the processing stage depicted in FIG. 1G to at least one sixth material removal process. The sixth material removal process may, for example, comprise an abrasive planarization process, such as a CMP process. The sixth material removal process may remove a portion of the plug material 128 (FIG. 1G) vertically overlying an uppermost vertical boundary (e.g., an uppermost surface) of the third dielectric material 110 without substantially removing additional portions of the plug material 128 (FIG. 1G) vertically underlying the uppermost vertical boundary of the third dielectric material 110. In some embodiments, the sixth material removal process (e.g., CMP process) terminates upon reaching the uppermost vertical boundary of the third dielectric material 110. In additional embodiments, the sixth material removal process may also remove a portion of the third dielectric material 110 and corresponding portions (e.g., portions at the same vertical elevation as the removed portion of the third dielectric material 110) of the plug material 128 (FIG. 1G), but upper vertical boundaries of a remaining portion of the third dielectric material 110 and the plug structures 130 are formed to be substantially coplanar with one another.

Figure 1I:
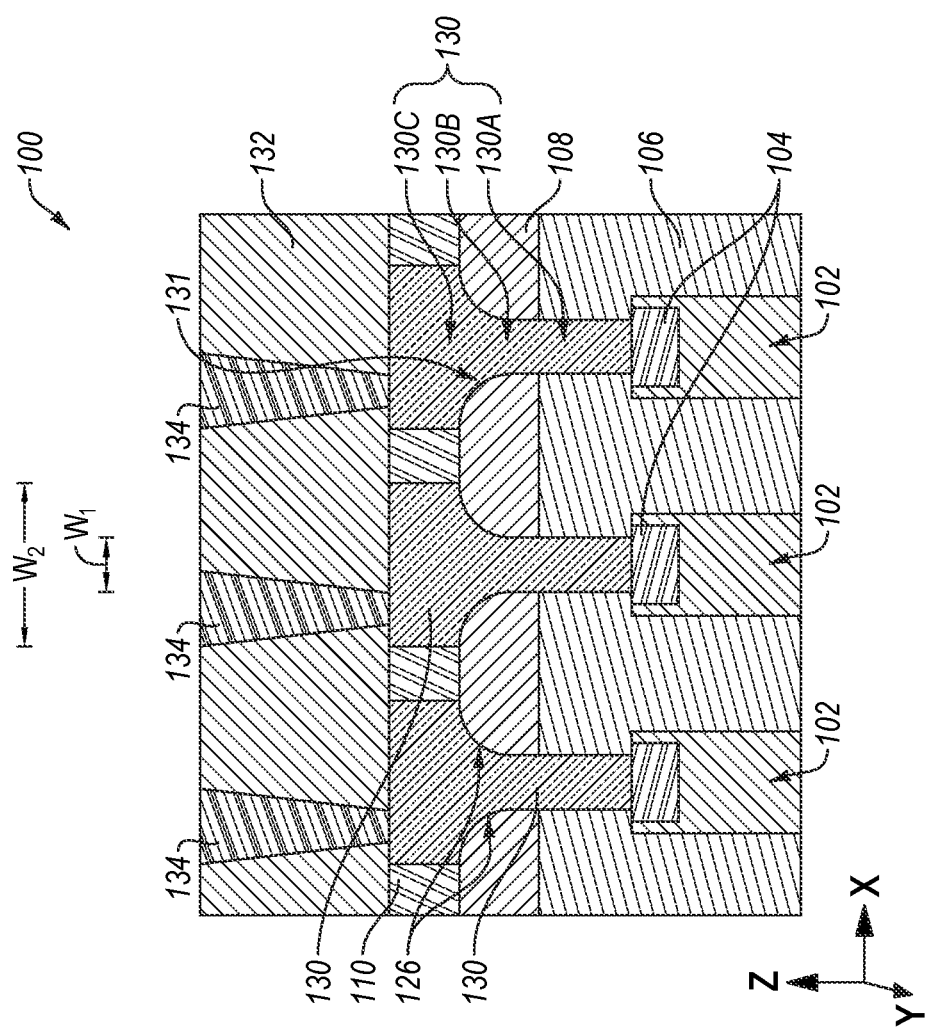

Referring next to FIG. 1I, a fourth dielectric material 132 may be formed on or over the third dielectric material 110 and the plug structures 130, and then additional contact structures 134 (e.g., digit line contact structures, bit line contact structures) may be formed to vertically extend through the fourth dielectric material 132 and contact (e.g., physically contact, electrically contact) the plug structures 130. As shown in FIG. 1I, in some embodiments, the additional contact structures 134 are formed to physically contact (e.g., land on) upper surfaces of the plug structures 130.

The fourth dielectric material 132 may be formed of and include at least one insulative material. A material composition of the fourth dielectric material 132 may be substantially the same as a material composition of the third dielectric material 110, or the material composition of the fourth dielectric material 132 may be different than the material composition of the third dielectric material 110. As a non-limiting example, the fourth dielectric material 132 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), at least one dielectric oxycarbide material (e.g., $SiO_xC_y$), at least one hydrogenated dielectric oxycarbide material (e.g., $SiC_xO_yH_z$), and at least one dielectric carboxynitride material (e.g., $SiO_xC_zN_y$). In some embodiments, the fourth dielectric material 132 is formed of and includes a dielectric oxide material (e.g., $SiO_x$, such as $SiO_2$). The fourth dielectric material 132 may be substantially homogeneous, or the fourth dielectric material 132 may be heterogeneous.

The additional contact structures 134 may be employed to couple the plug structures 130 (and, hence, the pillar contact structures 104 and the cell pillar structures 102) to conductive structures (e.g., conductive routing structures, conductive line structures) to subsequently be formed on or over the microelectronic device structure 100. By way of non-limiting example, the additional contact structures 134 may couple the plug structures 130 to digit line structures (e.g., bit line structures, data line structures) of a microelectronic device (e.g., a memory device, such as a 3D NAND Flash memory device) including the microelectronic device structure 100, as described in further detail below with reference to FIG. 2.

A geometric configuration (e.g., shape, dimensions) and horizontal position (e.g., in the X-direction and in the Y-direction) of each of the additional contact structures 134 at least partially depends on the geometric configurations and horizontal positions of the plug structures 130. As shown in FIG. 1I, each additional contact structure 134 may be formed to have horizontal dimensions (e.g., in the X-direction and in the Y-direction) less than or equal to corresponding horizontal dimensions of an uppermost vertical boundary (e.g., an uppermost surface) of an individual plug structure 130 in contact (e.g., physical contact, electrical contact) therewith. In some embodiments, a horizontal area of a lowermost vertical boundary of each additional contact structure 134 is less than a horizontal area of an uppermost vertical boundary of the plug structure 130 in physical contact therewith. The horizontal area of the lowermost vertical boundary of each additional contact structure 134 may be less than, equal to, or greater than a horizontal area of an uppermost vertical boundary of the additional contact structure 134. In some embodiments, the horizontal area of the lowermost vertical boundary of each additional contact structure 134 is less than the horizontal area of the uppermost vertical boundary of the additional contact structure 134, such that the additional contact structure 134 exhibits a tapered cross-sectional profile in one or more vertical planes (e.g., the ZY-plane, the ZX-plane). In addition, each additional contact structure 134 may be formed to have a desired horizontal cross-sectional shape (e.g., in the XY-plane). In some embodiments, each additional contact structure 134 is formed to exhibit a substantially circular horizontal cross-sectional shape. Furthermore, each of the additional contact structures 134 may be formed to have a desired horizontal position relative to the plug structure 130 in contact therewith. As shown in FIG. 1I, in some embodiments, each additional contact structure 134 is formed to have a horizontal center offset from (e.g., unaligned with) a horizontal center of the plug structure 130 in contact therewith. In additional embodiments, at least one (e.g., each) of the additional contact structures 134 is formed to have a horizontal center substantially aligned with a horizontal center of the plug structure 130 in contact therewith.

The additional contact structures 134 may be formed of and include conductive material. As a non-limiting example, the additional contact structures 134 may be formed of and include one or more of at least one metal, at least one alloy, and at least one conductive metal-containing material (e.g., a conductive metal nitride, a conductive metal silicide, a conductive metal carbide, a conductive metal oxide). A material composition of the additional contact structures 134 may be substantially the same as a material composition of one or more (e.g., each) of the plug structures 130 and the pillar contact structures 104, or the material composition of the plug material 128 may be different than the material composition of one or more (e.g., each) of the plug structures 130 and the pillar contact structures 104. In some embodiments, the additional contact structures 134 are formed of and include W. The additional contact structures 134 may individually be homogeneous, or the additional contact structures 134 may individually be heterogeneous.

Thus, in accordance with embodiments of the disclosure, a microelectronic device comprises pillar structures comprising semiconductive material, contact structures in physical contact with upper portions of the pillar structures, and conductive structures over and in physical contact with the contact structures. Each of the conductive structures comprises a lower portion having a first horizontal width, an upper portion vertically overlying the lower portion and having a second horizontal width greater than the first horizontal width, and an additional portion vertically interposed between the lower portion and the upper portion and having arcuate horizontal boundaries defining additional horizontal widths varying from the first horizontal width proximate the lower portion to a relatively larger horizontal width proximate the upper portion.

Furthermore, in accordance with embodiments of the disclosure, a method of forming a microelectronic device comprises forming contact structures in physical contact with upper portions of pillar structures comprising semiconductive material. Dielectric materials are formed over the contact structures. The dielectric materials comprise a first dielectric material over the contact structures, a second dielectric material over the first dielectric material, and a third dielectric material over the second dielectric material. The dielectric materials are patterned to form apertures extending to the contact structures. Each of the apertures comprises a first width within vertical boundaries of the first dielectric material, a second width greater than the first width within vertical boundaries of the third dielectric material, and multiple widths within vertical boundaries of the second dielectric material. The multiple widths increase from the first width proximate the first dielectric material to a relatively larger width proximate the third dielectric material. Conductive structures are formed within the apertures. The conductive structures substantially fill the apertures and physically contact the contact structures.

Microelectronic device structures (e.g., the microelectronic device structure 100 at or following the processing stage previously described with reference to FIG. 1I) of the disclosure may be included in microelectronic devices of the disclosure. For example, FIG. 2 illustrates a partial cutaway perspective view of a portion of a microelectronic device 201 (e.g., a memory device, such as a 3D NAND Flash memory device) including a microelectronic device structure 200. The microelectronic device structure 200 may be substantially similar to the microelectronic device structure 100 at or following the processing stage previously described with reference to FIG. 1I. For clarity and ease of understanding the drawings and associated description, some features (e.g., structures, materials) of the microelectronic device structure 100 previously described herein are not shown in FIG. 2. However, it will be understood that any features of the microelectronic device structure 100 at or following the processing stage previously described with reference to FIG. 1I that have been described herein with reference to one or more of FIGS. 1A through 1I may be included in the microelectronic device structure 200 of the microelectronic device 201 described herein with reference to FIG. 2.

Figure 2:
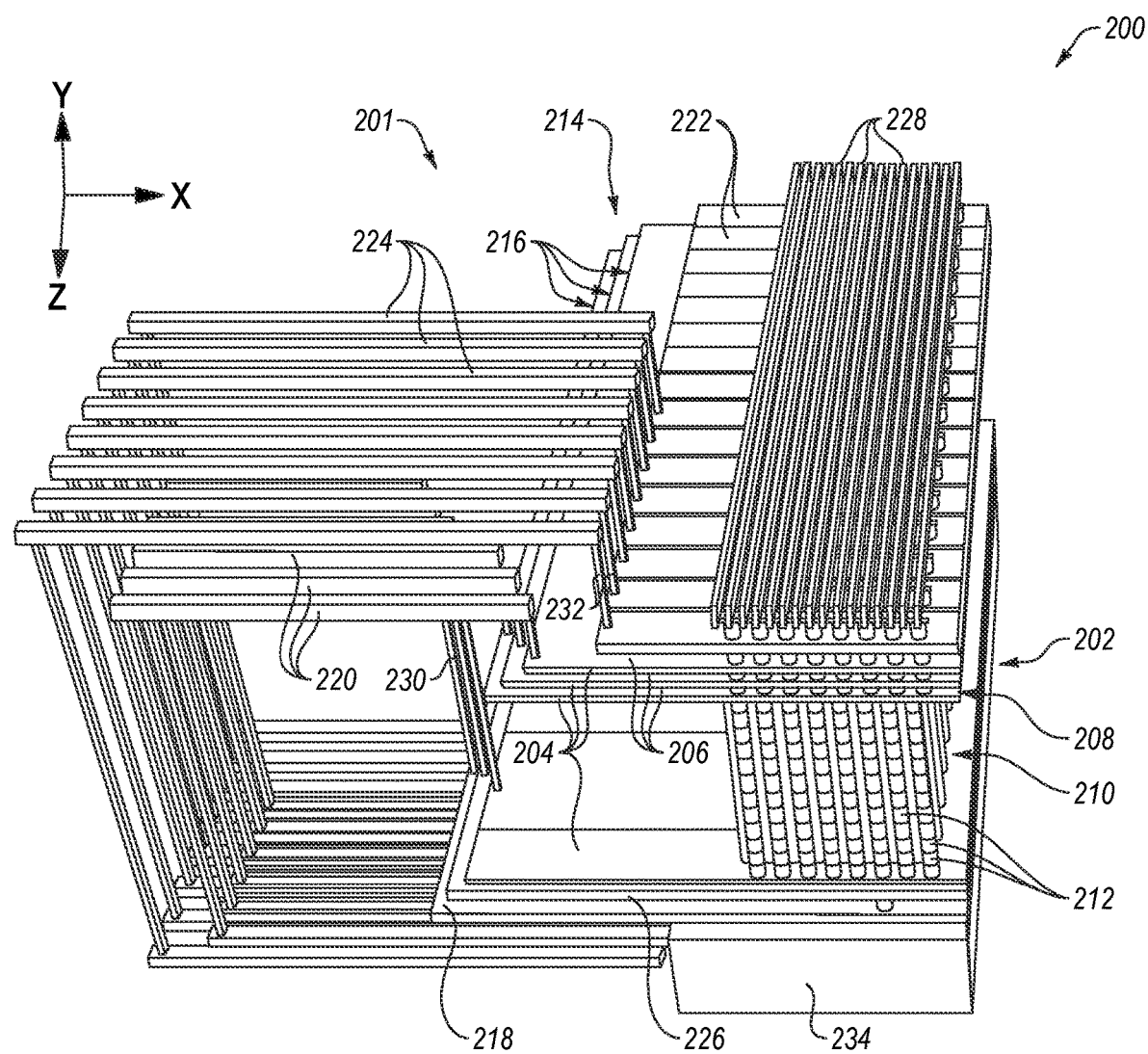
FIG. 2 is a simplified partial cutaway perspective view of a microelectronic device, in accordance with embodiments of the disclosure.

As shown in FIG. 2, in addition to the features of the microelectronic device structure 200 previously described herein in relation to the microelectronic device structure 100, the microelectronic device 201 may further include a stack structure 202 including a vertically alternating (e.g., in the Z-direction) sequence of conductive structures 204 and insulative structures 206 arranged in tiers 208 each including at least one of the conductive structures 204 vertically adjacent at least one of the insulative structures 206. Cell pillar structures 210 substantially similar to the cell pillar structures 102 previously described with reference to FIG. 1A vertically extend through the stack structure 202. Intersections of the cell pillar structures 210 and the conductive structures 204 of the stack structure 202 form strings of memory cells 212 vertically extending through the stack structure 202. The conductive structures 204 may serve as local access line structures (e.g., local word line structures) for the strings of memory cells 212. In addition, the microelectronic device 201 may also include one or more staircase structures 214 having steps 216 defined by edges (e.g., horizontal ends in the X-direction) of the tiers 208 of the stack structure 202. The steps 216 of the staircase structures 214 may serve as contact regions for the conductive structures 204 of the stack structure 202.

The microelectronic device 201 may further include at least one source structure 218, access line routing structures 220, first select gates 222 (e.g., upper select gates, drain select gates (SGDs)), select line routing structures 224, one or more second select gates 226 (e.g., lower select gates, source select gate (SGSs)), digit line structures 228, access line contact structures 230, and select line contact structures 232. The digit line structures 228 may be coupled to the cell pillar structures 210 by way of additional contact structures, plug structures, and pillar contact structures substantially similar to the additional contact structures 134, the plug structures 130, and the pillar contact structures 104 previously described with reference to FIG. 1I, respectively. For example, the digit line structures 228 may vertically overlie and physically contact the additional contact structures (e.g., the additional contact structures 134 (FIG. 1I)); the additional contact structures may vertically overlie and physically contact the plug structures (e.g., the plug structures 130 (FIG. 1I)); the plug structures may vertically overlie and physically contact the pillar contact structures (e.g., the pillar contact structures 104); and the pillar contact structures may physically contact the cell pillar structures 210 (e.g., corresponding to the cell pillar structures 102 (FIG. 1I)). In addition, the access line contact structures 230 and the select line contact structures 232 may couple additional features of the microelectronic device 201 to one another as shown (e.g., the select line routing structures 224 to the first select gates 222, the access line routing structures 220 to the conductive structures 204 of the tiers 208 of the stack structure 202).

The microelectronic device 201 may also include a base structure 234 positioned vertically below the cell pillar structures 210 (and, hence, the strings of memory cells 212). The base structure 234 may include at least one control logic region including control logic devices configured to control various operations of other features (e.g., the strings of memory cells 212) of the microelectronic device 201. As a non-limiting example, the control logic region of the base structure 234 may further include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), page buffers, decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control logic region of the base structure 234 may be coupled to the source structure 218, the access line routing structures 220, the select line routing structures 224, and the digit line structures 228. In some embodiments, the control logic region of the base structure 234 includes CMOS (complementary metal-oxide-semiconductor) circuitry. In such embodiments, the control logic region of the base structure 234 may be characterized as having a "CMOS under Array" ("CuA") configuration.

Thus, in accordance with embodiments of the disclosure, a memory device comprises a stack structure, at least one source structure, cell pillar structures, cell contact structures, conductive plug structures, and digit line structures. The stack structure comprises a vertically alternating sequence of insulative structures and conductive structures. The at least one source structure underlies the stack structure. The cell pillar structures vertically extend through the stack structure and are coupled to the at least one source structure. The cell contact structures are coupled to cell pillar structures. The conductive plug structures overlie and are coupled to the cell contact structures. Each of the conductive plug structures comprises a first portion having first horizontal boundaries extending substantially perpendicular to upper surfaces of the cell contact structures, a second portion overlying the first portion and having second horizontal boundaries exhibiting a radiused, concave shape, and a third portion overlying the second portion and having third horizontal boundaries extending substantially perpendicular to the upper surfaces of the cell contact structures. The digit line structures overlie and are coupled to the conductive plug structures.

Figure 3:
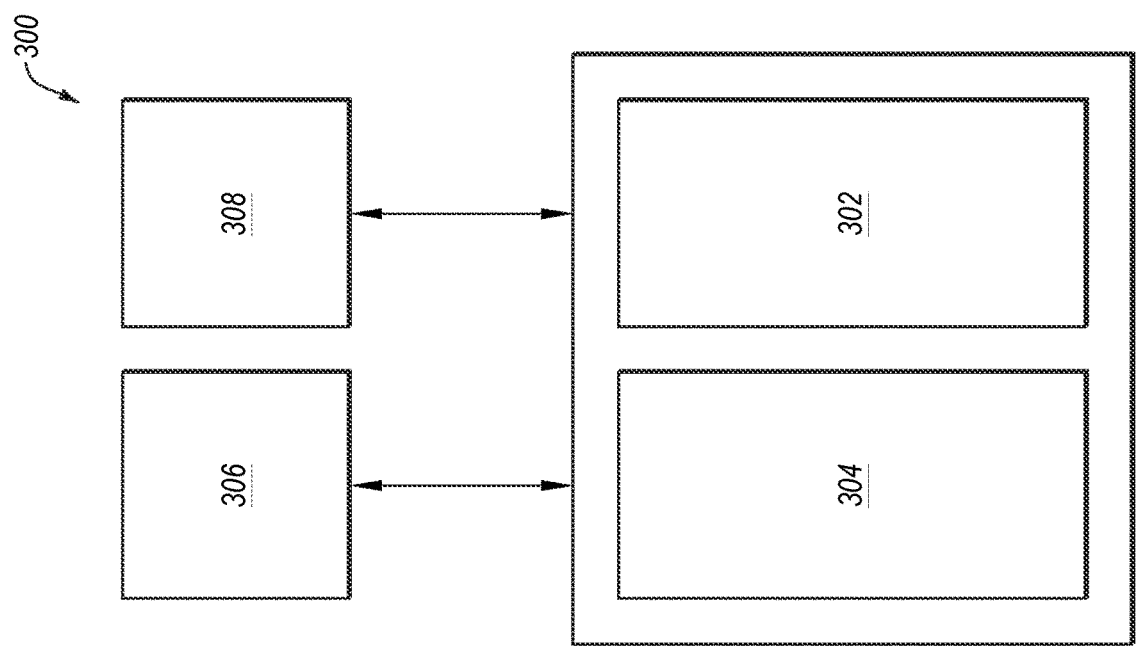
FIG. 3 is a schematic block diagram illustrating an electronic system, in accordance with embodiments of the disclosure.

Microelectronic devices structures (e.g., the microelectronic device structure 100 at or following the processing stage previously described with reference to FIG. 1I) and microelectronic devices (e.g., the microelectronic device 201 (FIG. 2)) in accordance with embodiments of the disclosure may be used in embodiments of electronic systems of the disclosure. For example, FIG. 3 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 300 includes at least one memory device 302. The memory device 302 may comprise, for example, one or more of a microelectronic device structure (e.g., the microelectronic device structure 100 (FIG. 1I)) and a microelectronic device (e.g., the microelectronic device 201 (FIG. 2)) previously described herein. The electronic system 300 may further include at least one electronic signal processor device 304 (often referred to as a "microprocessor"). The electronic signal processor device 304 may, optionally, include one or more of a microelectronic device structure (e.g., the microelectronic device structure 100 (FIG. 1I)) and a microelectronic device (e.g., the microelectronic device 201 (FIG. 2)) previously described herein. While the memory device 302 and the electronic signal processor device 304 are depicted as two (2) separate devices in FIG. 3, in additional embodiments, a single (e.g., only one) memory/processor device having the functionalities of the memory device 302 and the electronic signal processor device 304 is included in the electronic system 300. In such embodiments, the memory/processor device may include one or more of a microelectronic device structure (e.g., the microelectronic device structure 100 (FIG. 1I)) and a microelectronic device (e.g., the microelectronic device 201 (FIG. 2)) previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 may comprise a single touchscreen device that can be used both to input information to the electronic system 300 and to output visual information to a user. The input device 306 and the output device 308 may communicate electrically with one or more of the memory device 302 and the electronic signal processor device 304.

Thus, in accordance with embodiments of the disclosure, an electronic system comprises an input device, an output device, a processor device operably coupled to the input device and the output device, and a memory device operably coupled to the processor device. The memory device comprises at least one microelectronic device structure comprising vertically extending strings of memory cells coupled to access line structures and at least one source structure, conductive structures overlying and coupled to the vertically extending strings of memory cells, and digit line structures overlying and coupled to the conductive structures. Each of the conductive structures comprises a lower portion having a first width, an upper portion having a second width greater than the first width, and an intervening portion between the lower portion and the upper portion and having horizontal boundaries exhibiting an arcuate, concave shape defining additional widths varying from the first width proximate the lower portion to a relatively larger width proximate the upper portion.

The structures and devices of the disclosure advantageously facilitate one or more of improved microelectronic device performance, reduced costs (e.g., manufacturing costs, material costs), increased miniaturization of components, and greater packaging density as compared to conventional structures, conventional devices, and conventional methods. For example, the methods and structures of the disclosure may reduce undesirable capacitive coupling between horizontally neighboring conductive structures (e.g., horizontally neighboring plug structures coupling digit line structures to vertically extending strings of memory cells) as compared to conventional methods and structures while maintaining or even decreasing feature sizes. The structures and devices of the disclosure may also improve scalability, efficiency, and simplicity as compared to conventional structures and conventional devices.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A microelectronic device, comprising:
pillar structures comprising semiconductive material;
contact structures in physical contact with upper portions of the pillar structures;
conductive structures over and in physical contact with the contact structures, each of the conductive structures being substantially monolithic and comprising:
a lower portion having first substantially linear boundaries in a vertically oriented plane and a first maximum horizontal width;
an upper portion vertically overlying the lower portion, the upper portion having second substantially linear boundaries in the vertically oriented plane and a second maximum horizontal width greater than the first maximum horizontal width; and
an additional portion vertically interposed between the lower portion and the upper portion and having arcuate boundaries in the vertically oriented plane, the arcuate boundaries exhibiting a radiused, concave shape in the vertically oriented plane and defining additional horizontal widths progressively increasing from the first maximum horizontal width proximate the lower portion to a relatively larger horizontal width proximate the upper portion;
a first dielectric oxide material substantially horizontally surrounding the lower portion of each of the conductive structures along an entire vertical height of the lower portion;
a second dielectric material overlying the first dielectric oxide material and substantially horizontally surrounding the additional portion of each of the conductive structures along an entire vertical height of the additional portion, the second dielectric material having arcuate edges exhibiting a radiused, convex shape in the vertically oriented plane and opposing the arcuate boundaries of the additional portion of each of the conductive structures; and
a third dielectric oxide material overlying the second dielectric material and substantially horizontally surrounding the upper portion of each of the conductive structures along an entire vertical height of the upper portion.

2. The microelectronic device of claim 1, wherein horizontal centers of the conductive structures are substantially aligned with horizontal centers of the contact structures in physical contact therewith.

3. The microelectronic device of claim 1, wherein the lower portion of at least one of the conductive structures is substantially confined within horizontal boundaries of at least one of the contact structures in physical contact therewith.

4. The microelectronic device of claim 3, wherein the upper portion of the at least one of the conductive structures horizontally extends beyond the horizontal boundaries of the at least one of the contact structures.

5. The microelectronic device of claim 1, further comprising additional contact structures over and in physical contact with the conductive structures.

6. The microelectronic device of claim 5, wherein horizontal centers of the additional contact structures are offset from horizontal centers of the conductive structures in physical contact therewith.

7. The microelectronic device of claim 5, wherein at least one of the additional contact structures is substantially confined within horizontal boundaries of the upper portion of at least one of the conductive structures in physical contact therewith.

* * * * *

UNITED STATES PATENT AND TRADEMARK OFFICE
CERTIFICATE OF CORRECTION

PATENT NO. : 11,869,841 B2
APPLICATION NO. : 16/952939
DATED : January 9, 2024
INVENTOR(S) : Sidhartha Gupta It is certified that error appears in the above-identified patent and that said Letters Patent is hereby corrected as shown below:

In the Specification

Column 6, Line 66, change "oxide (TiO), zinc" to --oxide ($Ti_xO$), zinc--
Column 8, Line 45, change "$SiO_x$ (e.g $SiO_2$)." to --$SiO_x$ (e.g., $SiO_2$).--

Signed and Sealed this
Twelfth Day of March, 2024

Katherine Kelly Vidal
Director of the United States Patent and Trademark Office